(12) United States Patent
Meineke et al.

(10) Patent No.: US 10,761,170 B2
(45) Date of Patent: Sep. 1, 2020

(54) SEGMENTATION OF QUANTITATIVE SUSCEPTIBILITY MAPPING MAGNETIC RESONANCE IMAGES

(71) Applicant: KONINKLIJKE PHILIPS N.V., Eindhoven (NL)

(72) Inventors: Jan Jakob Meineke, Eindhoven (NL); Ulrich Katscher, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 135 days.

(21) Appl. No.: 16/062,146

(22) PCT Filed: Dec. 12, 2016

(86) PCT No.: PCT/EP2016/080546
§ 371 (c)(1),
(2) Date: Jun. 14, 2018

(87) PCT Pub. No.: WO2017/102611
PCT Pub. Date: Jun. 22, 2017

(65) Prior Publication Data
US 2018/0372826 A1 Dec. 27, 2018

(30) Foreign Application Priority Data
Dec. 17, 2015 (EP) .................... 15200768

(51) Int. Cl.
*G06K 9/00* (2006.01)
*G01R 33/56* (2006.01)
(Continued)

(52) U.S. Cl.
CPC ....... *G01R 33/5608* (2013.01); *G01R 33/243* (2013.01); *G01R 33/56* (2013.01); *G01R 33/5601* (2013.01); *G01R 33/56536* (2013.01)

(58) Field of Classification Search
None
See application file for complete search history.

(56) References Cited

U.S. PATENT DOCUMENTS

| | | |
|---|---|---|
| 8,693,761 B2 | 4/2014 | Haacke et al. |
| 8,781,197 B2 | 7/2014 | Wang et al. |

(Continued)

OTHER PUBLICATIONS

Tang et al "Improving Susceptibility Mapping Using a Threshold-Based K-Space/Image Domain Iterative Reconstruction Approach" Magn. Reson. in Med. 69:p. 1396-1407 (2013).

(Continued)

*Primary Examiner* — Shervin K Nakhjavan (57) ABSTRACT

The invention provides for a medical imaging system (100, 400) comprising: a memory (112) for storing machine executable instructions and a processor (106) for controlling the medical imaging system. Execution of the machine executable instructions cause the processor to: receive (200) a preliminary segmentation (124) from a preliminary magnetic resonance image (122) of a region of interest (409), wherein the preliminary segmentation comprises preliminary segmentation edges; reconstruct (202) a first QSM image (124) for the region of interest from QSM magnetic resonance data (122), wherein the reconstruction of the QSM image is at least partially performed using a regularization function, wherein the regularization function is dependent upon the preliminary segmentation edges during reconstruction of the first QSM image; calculate (204) a first segmentation (126) by segmenting the first QSM image using a QSM image segmentation algorithm (134), wherein the first segmentation comprises first segmentation edges; and reconstruct (206) a second QSM image (128) for the region of interest from the QSM magnetic resonance data, wherein the reconstruction of the second QSM image is at least partially performed using the regularization function, (Continued)

wherein the regularization function is dependent upon the first segmentation edges.

22 Claims, 7 Drawing Sheets

(51) Int. Cl.
  *G01R 33/24* (2006.01)
  *G01R 33/565* (2006.01)

(56) References Cited

U.S. PATENT DOCUMENTS

| | | | | |
|---|---|---|---|---|
| 9,448,289 | B2* | 9/2016 | Wang | G01R 33/24 |
| 2010/0142785 | A1* | 6/2010 | Dahnke | G01R 33/286 |
| | | | | 382/131 |
| 2011/0044524 | A1* | 2/2011 | Wang | G01R 33/54 |
| | | | | 382/131 |
| 2012/0321162 | A1* | 12/2012 | Liu | G01R 33/443 |
| | | | | 382/131 |
| 2013/0021372 | A1 | 1/2013 | Wiemker et al. | |
| 2013/0102879 | A1* | 4/2013 | Maclaren | G01R 33/243 |
| | | | | 600/411 |
| 2014/0184219 | A1* | 7/2014 | Kim | G01R 33/48 |
| | | | | 324/309 |
| 2014/0219533 | A1* | 8/2014 | Sato | G06T 11/008 |
| | | | | 382/131 |
| 2015/0002148 | A1* | 1/2015 | Liu | A61B 5/055 |
| | | | | 324/309 |
| 2015/0168525 | A1* | 6/2015 | Sato | G01R 33/5608 |
| | | | | 324/318 |
| 2015/0310639 | A1* | 10/2015 | Bilgic | G01R 33/243 |
| | | | | 382/131 |
| 2015/0338492 | A1* | 11/2015 | Sato | G01R 33/5608 |
| | | | | 600/410 |
| 2017/0097399 | A1* | 4/2017 | Shiodera | G01R 33/385 |
| 2017/0124706 | A1* | 5/2017 | Shiodera | G06T 5/005 |
| 2018/0059198 | A1* | 3/2018 | Shirai | A61B 5/055 |
| 2018/0180688 | A1* | 6/2018 | Koch | A61B 5/0042 |

OTHER PUBLICATIONS

Meineke et al "Quantitative Susceptibility Mapping Using Segmentation-Enabled Dipole Inversion" Proc. 23rd ISMRM p. 3321 (2015).

Li et al "A Method for Estimating and Removing Streaking Artifacts in Quantitative Susceptibility Mapping" NeuroImage, vol. 108, Dec. 20, 2014, p. 111-122.

Bao et al "Structural Feature Based Collaborative Reconstruction for Quantitative Susceptibililty Mapping" Proc. of the Int. Soc. for Mag. Reson. in Med. p. 3322, May 15, 2015.

Sato et al "Improving Estimation of Small-Vein Susceptibility by Using a Pre-Estimated Susceptibility Map" Proc. of the Int. Soc. for Mag. Reson. in Med. p. 927, May 15, 2015.

Schweser et al "Foundations MRI Phase Imaging and Processing for Quantitative Susceptibility Mapping" Zeitschrift Fuer Medizinische Physik, vol. 26, No. 1, Dec. 15, 2015, p. 6-34.

Wang and Liu, "Quantitative Susceptibility Mapping (QSM) Decoding MRI Data for a Tissue Magnetic Biomarker" MRM 73, p. 82-101 (2015).

Liu et al., "Morphology Enabled Dipole Inversion from a Single Angle Acquisition . . . "MRM 66, p. 777-783 (2011).

Ecabert et al., "Automatic Model-Based Segmentation of the Heart in CT Images" IEEE Transactions on Medical Imaging vol. 27, No. 9, p. 1189-1201 (2008).

Liu "Technical Improvements in Quantitative Susceptibility Mapping" Doctoral Thesis 2014.

Khabipova et al "A Modulated Closed Form Solution for Quantitative Susceptibility Mapping—A Thorough Evaluation and Comparison to Iterative Methods Based on Edge Prior Knowledge" NeuroImage 107 (2015) p. 163-174.

Liu et al "Morphology Enabled Dipole Inversion for Quantitative Susceptibility Mapping Using Structural Consistency Between the Magnatude Image and the Susceptibity Map" NeuroImage, Feb. 1, 2012, 59(3) p. 2560-2568.

* cited by examiner

SEGMENTATION OF QUANTITATIVE SUSCEPTIBILITY MAPPING MAGNETIC RESONANCE IMAGES

CROSS REFERENCE TO RELATED APPLICATIONS

This application is a U.S. national phase application of International Application No. PCT/EP2016/080546, filed on Dec. 12, 2016, which claims the benefit of EP Application Serial No. 15200768.8 filed on Dec. 17, 2015 and is incorporated herein by reference.

TECHNICAL FIELD OF THE INVENTION

The invention relates to magnetic resonance imaging, in particular to quantitative susceptibility mapping.

BACKGROUND OF THE INVENTION

Quantitative susceptibility mapping (QSM) is a magnetic resonance imaging technique in where the voxel intensity is linearly proportional to the underlying tissue apparent magnetic susceptibility. This may be useful for identifying certain biomarkers or contrast agents, such as gadolinium, which cause local changes in the magnetic susceptibility. The bulk magnetic susceptibility distribution of tissue in vivo is calculated from gradient echo magnetic resonance phase images. These images may be particularly useful in showing anatomical contrast between white and gray matter in the brain.

The journal article Tang et. al., "Improving Susceptibility Mapping Using a Threshold-Based K-Space/Image Domain Iterative Reconstruction Approach," Magnetic Resonance in Medicine 69: 1396-1407 (2013) describes a method of improving magnetic resonance imaging qualitative susceptibility maps by using geometric information from the susceptibility map itself as a constraint to overcome the ill-posed nature of the inverse filter. This paper illustrates applying this approach to vessels and other structures with lower susceptibility to reduce streaking artifacts.

The conference abstract Meineke, "Quantitative Susceptibility Mapping using Segmentation-Enabled Dipole Inversion," Proc. $23^{rd}$ ISMRM, p. 3321 (2015) (herein "Meineke et. al.") discloses a QSM reconstruction which uses a binary map to define tissue boundary edges to improve gradient-based edge detection. The US-patent application US2015/0338492 concerns quantitative susceptibility mapping (QSM) in which edge information is employed in an $L_1$-norm regularisation to calculate the magnetic susceptibility image. The edge information is calculated by way of and edge mask.

SUMMARY OF THE INVENTION

The invention provides for a medical imaging system, a computer program product, and a method in the independent claims. Embodiments are given in the dependent claims.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins using the antenna of a Magnetic resonance apparatus during a magnetic resonance imaging scan. Magnetic resonance data is an example of medical image data. A Magnetic Resonance Imaging (MRI) image is defined herein as being the reconstructed two or three dimensional visualization of anatomic data contained within the magnetic resonance imaging data. This visualization can be performed using a computer. QSM magnetic resonance data is an example of magnetic resonance data. QSM magnetic resonance data is magnetic resonance data that has been acquired according to a QSM magnetic resonance data protocal and may be reconstructed into a QSM image.

In one aspect the invention provides for a medical system comprising a memory for storing machine-executable instructions. The medical imaging system further comprises a processor for controlling the medical imaging system. Execution of the machine-executable instructions causes the processor to receive a preliminary segmentation from a preliminary magnetic resonance image of a region of interest. The preliminary segmentation comprises preliminary segmentation edges. The edges in a segmentation may be interpreted or defined as being boundaries between different regions identified in the segmentation.

Execution of the machine-executable instructions further cause the processor to reconstruct a first QSM image for the region of interest from QSM magnetic resonance data. The reconstruction of the QSM image is at least partially performed using a regularization function. The regularization function is dependent upon the preliminary images during reconstruction of the first QSM image. That is to say when the QSM image is reconstructed a regularization function is used in the reconstruction. The regularization function is dependent upon or uses the preliminary segmentation edges. The regularization function may be able to use different edges determined from segmentations. In this particular instance the preliminary segmentation edges are used. It is observed that segmentation leads to well-defined boundaries between adjacent tissues and allows full decoupling of the susceptibility difference. Accordingly, the segmentation provides more reliable and continuous borders between structures.

Execution of the machine-executable instructions further cause the processor to calculate a first segmentation by segmenting the first QSM image using a QSM image segmentation algorithm. The term QSM image segmentation algorithm is simply a label for a segmentation algorithm. The term QSM image before a segmentation algorithm is used to indicate that the segmentation algorithm has been modified or trained to segment QSM images. Normal and customary segmentation algorithms may be modified to function as QSM image segmentation algorithms. Some modification may be useful in some cases because the QSM images may show different details that are shown in conventional magnetic resonance images such as T1, T2, or proton density images. The first segmentation comprises first segmentation edges.

Execution of the machine-executable instructions further causes the processor to reconstruct a second QSM image for the region of interest from the QSM magnetic resonance data. The reconstruction of the second QSM image is at least partially performed using the regularization function. The regularization function is dependent upon the first segmentation edge which is during reconstruction of the second QSM image.

This embodiment may be beneficial because it may provide for a superior reconstruction of QSM images. A knowledge of where the boundaries are in a subject may be useful in guiding the reconstruction of a QSM image. A difficulty is that QSM images may show different details than are visible in conventional images such as proton weighted or T1 weighted images. If segmentation edges are provided by a conventional magnetic resonance image it may lead to minor errors in the segmentation of the QSM image.

In another embodiment after the second QSM image has been reconstructed it may be stored in a memory system or may be displayed on a screen for a doctor or technologist.

In another embodiment execution of the machine-executable instructions further causes the processor to iteratively recalculate the first segmentation by segmenting the second QSM image using the QSM image segmentation algorithm and then by reconstructing the second QSM image for the region of interest from the QSM magnetic resonance data. After the second QSM image is reconstructed this image is then segmented and this new segmentation is then used to reconstruct the second QSM image again. This may be advantageous because as the boundaries or edges within the segmentation are determined better the QSM image reconstruction may become more accurate. Recalculating or reconstructing the second QSM image multiple times in an iterative fashion may lead to improved calculation of the QSM image.

In another embodiment the iterative reconstruction of the second QSM image is performed a predetermined number of times. That is to say the iterative process ends after the second QSM image has been reconstructed the predetermined number of times.

In another embodiment the iterative reconstruction of the second QSM image is performed until a convergence metric is within a predetermined range. The convergence metric may be a statistical measure or metric which is used to determine if the QSM image has converged to a stable or closed solution. For example the second QSM image may be compared to the previous iteration on a voxel-by-voxel basis and a statistical measure may be used to determine the total amount of the change between the two images.

In another embodiment the medical imaging system further comprises a magnetic resonance imaging system.

In other embodiments the medical imaging system is a magnetic resonance imaging system.

In another embodiment the memory further stores QSM pulse sequence commands. The QSM pulse sequence commands cause the magnetic resonance imaging system to acquire QSM magnetic resonance data according to a magnetic resonance quantitative susceptibility mapping protocol. Execution of the machine-executable instructions further causes the processor to control the magnetic resonance imaging system to acquire the QSM magnetic resonance data using the QSM pulse sequence commands. This embodiment may be beneficial because the same system acquires the QSM magnetic resonance data and then performs an improved method of generating the QSM images.

In another embodiment execution of the machine-executable instructions further causes the processor to reconstruct the preliminary image for the region of interest from the QSM magnetic resonance data. The step of receiving the preliminary segmentation comprises calculating the preliminary segmentation by segmenting the preliminary image using the QSM image segmentation algorithm. In this case the QSM image segmentation algorithm may be modified such that the regularization function is dropped or not used from the reconstruction. This may be because at this point there is no segmentation that has been performed.

In another embodiment the preliminary magnetic resonance image is a survey image. As used herein a survey image may refer to a magnetic resonance imaging data and image there acquired and then generated before another magnetic resonance imaging protocol is performed. For example the survey image may be acquired and then generated so that it is better known where to position the region of interest. The survey image may be one of a variety of different types of images. For example it may be a T1 weighted image, a proton density image, a T2 weighted image, or many other different types of magnetic resonance images.

In another embodiment receiving the preliminary segmentation comprises calculating the preliminary segmentation by segmenting the preliminary image using a survey image segmentation algorithm. As used herein the term survey image segmentation algorithm is a segmentation algorithm that is identified by the term survey image. For example the survey image segmentation algorithm and the QSM image segmentation algorithm may be similar or identical algorithms but they have been trained or detailed differently.

The survey image segmentation algorithm and/or the QSM image segmentation algorithm may be one of a variety of different types. They may be for example a deformable shape model, a model which identifies anatomical landmarks, or a model which uses an anatomical atlas for performing the segmentation. As different details may be seen in the QSM images and the survey images the implementation of the QSM image segmentation algorithm and the survey image segmentation algorithm may be different.

In another embodiment the memory further contains survey image pulse sequence commands. Execution of the machine-executable instructions further causes the processor to control the magnetic resonance imaging system to acquire survey magnetic resonance imaging data by controlling the magnetic resonance imaging system with the survey image pulse sequence commands. Execution of the machine-executable instructions further causes the processor to reconstruct the survey magnetic resonance image using the survey magnetic resonance imaging data.

In another embodiment the reconstruction of the first QSM image and/or the second QSM image comprise solving the following equation:

$$\chi = \arg\min \; \| W_1 \left( L\left(\frac{B_0\gamma}{2\pi}D(\chi)\right) - L(f) \right) \| + \lambda \| W_2 \; \vec{G}(\chi) \|,$$

The following equation is a least squares problem this is used to solve for the QSM image, B0 is the external magnetic field, α is the geometric ratio, D is the dipole operator, L is a Laplacian, λ is a regularization parameter, G is a gradient operator, $W_1$ is a binary mask for data-fidelity and $W_2$ is a binary mask for regularization. The preliminary segmentation edges or the first segmentation edges may be incorporated in $W_2$. For example in the vicinity of the edges $W_2$ may be set to 0. This prevents the regularization function from penalizing the high gradients near the segmentation edges. The term including the regularization parameter λ is a regularization function. This equation is described in Meineke et. al. The vertical double bars in the above equation represent the calculation of a norm. For example the norm may be, but is not limited to, a L1 norm, an L2 norm, or an Lx norm.

In another embodiment the regularization function is:

$$\lambda \| W_2 \vec{G}(\chi) \|$$

In another embodiment the QSM image segmentation algorithm is trained and/or configured using QSM images. In some examples the QSM image segmentation algorithm may be a typical image segmentation algorithm that is used for segmenting other types of magnetic resonance images. For example the QSM algorithm could be an anatomical model, it could also be a method where the images fit to an anatomical atlas. In another example the QSM image segmentation may be a deformable shape model. In another example the QSM image segmentation algorithm may be based on a trained or learning-based method such as a neural network. There may be advantages in using a conventional image segmentation algorithm that is configured or trained for QSM images because other details which are present in QSM images may not be present in normal anatomical atlases or models.

In another aspect the invention provides for a method of operating a medical imaging system. Execution of the machine-executable instructions causes the processor to receive a preliminary segmentation from a preliminary magnetic resonance image of a region of interest. The preliminary segmentation comprises preliminary segmentation edges. Execution of the machine-executable instructions further causes the processor to reconstruct a first QSM image from the region of interest from QSM magnetic resonance data. The reconstruction of a QSM image is at least partially performed using the regularization function. The regularization function is dependent upon the preliminary segmentation edges during reconstruction of the first QSM image.

Execution of the machine-executable instructions further cause the processor to calculate a first segmentation by segmenting the first QSM image using a QSM image segmentation algorithm. The first segmentation comprises first segmentation edges. Execution of the machine-executable instructions further causes the processor to reconstruct a second QSM image from the region of interest from the QSM magnetic resonance data. The reconstruction of the second QSM image is at least partially performed using the regularization function. The regularization function is dependent upon the first segmentation edges during reconstruction of the second QSM image.

In another aspect the invention provides for a computer program product containing machine-executable instructions for execution by a processor controlling a medical imaging system. Execution of the machine-executable instructions causes the processor to receive a preliminary segmentation from a preliminary magnetic resonance image of a region of interest. The preliminary segmentation comprises preliminary segmentation edges. Execution of the machine-executable instructions further causes the processor to reconstruct a first QSM image for the region of interest from the QSM magnetic resonance image. The reconstruction of the QSM image is at least partially performed using the regularization function. The regularization function is dependent upon the preliminary segmentation edges during reconstruction of the first QSM image.

Execution of the machine-executable instructions further causes the processor to calculate a first segmentation by segmenting the first QSM image using a QSM image segmentation algorithm. The first segmentation comprises first segmentation edges. Execution of the machine-executable instructions further causes the processor to reconstruct a second QSM image for the region of interest from the QSM magnetic resonance data. The reconstruction of the second QSM image is at least partially performed using the regularization function. The regularization function is dependent upon the first segmentation edges during reconstruction of the second QSM image.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
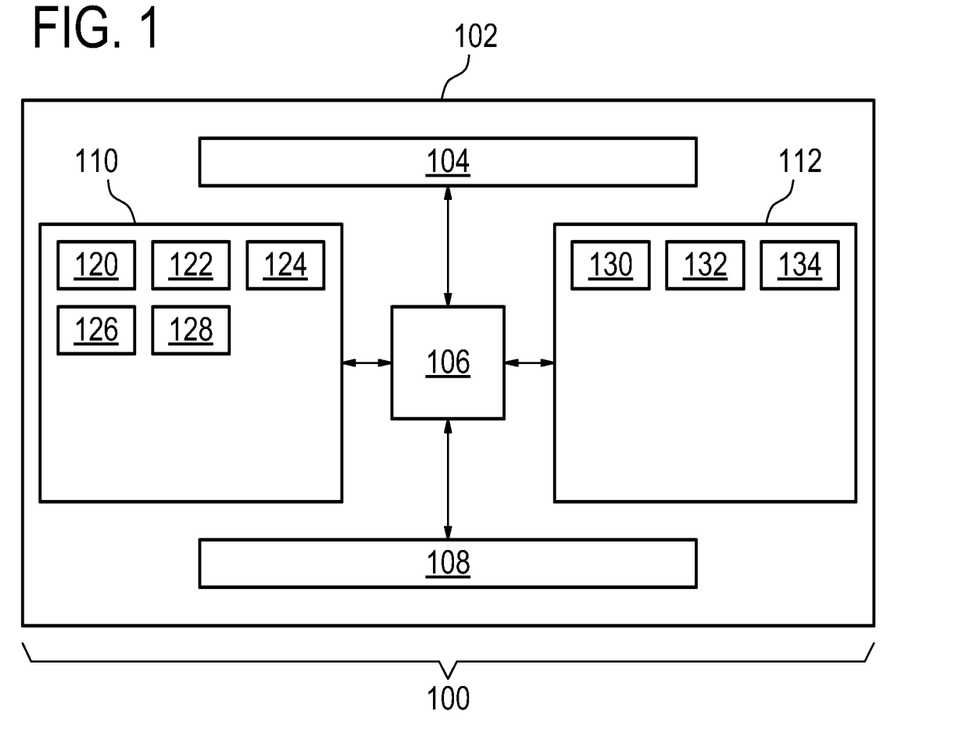
FIG. 1 illustrates an example of a medical imaging system.

FIG. 1 shows an example of a medical imaging system 100. The medical imaging system 100 is shown as comprising a computer system 102. The computer system 102 may for instance have a hardware 104 or a network interface. The computer system is further shown as containing a processor 106 that is connected to the hardware or network interface 104, a user interface 108, computer storage 110, and computer memory 112.

The computer storage 110 is shown as containing preliminary magnetic resonance data 120. The computer storage 110 is further shown as containing a preliminary magnetic resonance image that was reconstructed from the preliminary magnetic resonance data 120. The computer storage 110 is further shown as containing a preliminary segmentation 124 of the preliminary magnetic resonance image 122. The presence of the preliminary magnetic resonance data 120 and the preliminary magnetic resonance image 122 is optional. For example the computer system 102 could have received the preliminary segmentation 124 already performed. In other examples the computer system 102 could reconstruct the preliminary magnetic resonance image 122 from the preliminary magnetic resonance data 120 and then determine the segmentation 124 by segmenting the preliminary magnetic resonance image 122. The computer storage 110 is further shown as containing QSM magnetic resonance data 120. In some examples the processor 106 could control a magnetic resonance imaging system to acquire the QSM magnetic resonance data 120. In other examples the QSM magnetic resonance data 120 may be received over a network connection or other storage device. The computer storage 110 is further shown as containing a first QSM image 124 that was reconstructed from the QSM magnetic resonance data 120. The computer storage 110 is further shown as containing a first segmentation 126 of the first QSM image 124. The computer storage 110 is further shown as containing a second QSM image 128 that was reconstructed using the QSM magnetic resonance data 120 and the first segmentation 126.

The computer memory 112 is shown as containing machine-executable instructions 130 that enable the processor 106 to perform such things as control the medical imaging system 100 and also to perform various numerical and image processing techniques as is detailed in FIG. 2, FIG. 3, FIG. 5, and FIG. 6. The computer memory 112 is further shown as containing an optional survey scan image segmentation algorithm 132 that may be optionally used for example for segmenting the preliminary magnetic resonance image 122. The computer storage 112 is further shown as containing a QSM image segmentation algorithm 134 which for example may be used for segmenting the first QSM image 124 and/or the second QSM image 128. The survey scan image segmentation algorithm 132 and the QSM image segmentation algorithm 134 may be in some cases essentially the same algorithm that is trained or adjusted differently depending upon the various features which are visible in the preliminary magnetic resonance image 122 or the QSM images 124, 128. In other cases the segmentation algorithm 132 and the algorithm 134 are different.

Figure 2:
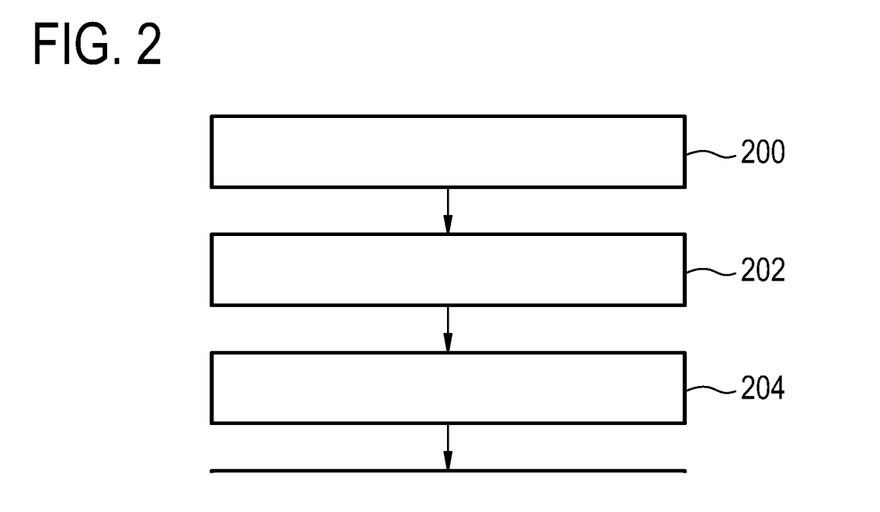
FIG. 2 shows a flow chart which shows a method of operating the medical imaging system of FIG. 1.

FIG. 2 shows a flowchart which illustrates a method of using the medical imaging system 100 of FIG. 1. First in step 200 the preliminary segmentation 124 is received. In some examples the preliminary segmentation 124 is received from an external device and has already been performed. In other examples the processor 106 may control a magnetic resonance imaging system to acquire the preliminary magnetic resonance data 120 then to reconstruct the preliminary magnetic resonance image 122 and then finally to segment this image 122 to calculate the preliminary segmentation 124.

Next in step 202 a first QSM image 124 is reconstructed for the region of interest from the QSM magnetic resonance data 122. Next in step 204 a first segmentation 126 is calculated by segmenting the first QSM image 124 using a QSM image segmentation algorithm 134. The first segmentation comprises first segmentation edges. Then finally in step 206 a second QSM image 128 is reconstructed for the region of interest from the QSM magnetic resonance data. The reconstruction of the second QSM image is at least partially performed using the regularization function. The regularization function is dependent upon the first segmentation edges.

Figure 3:
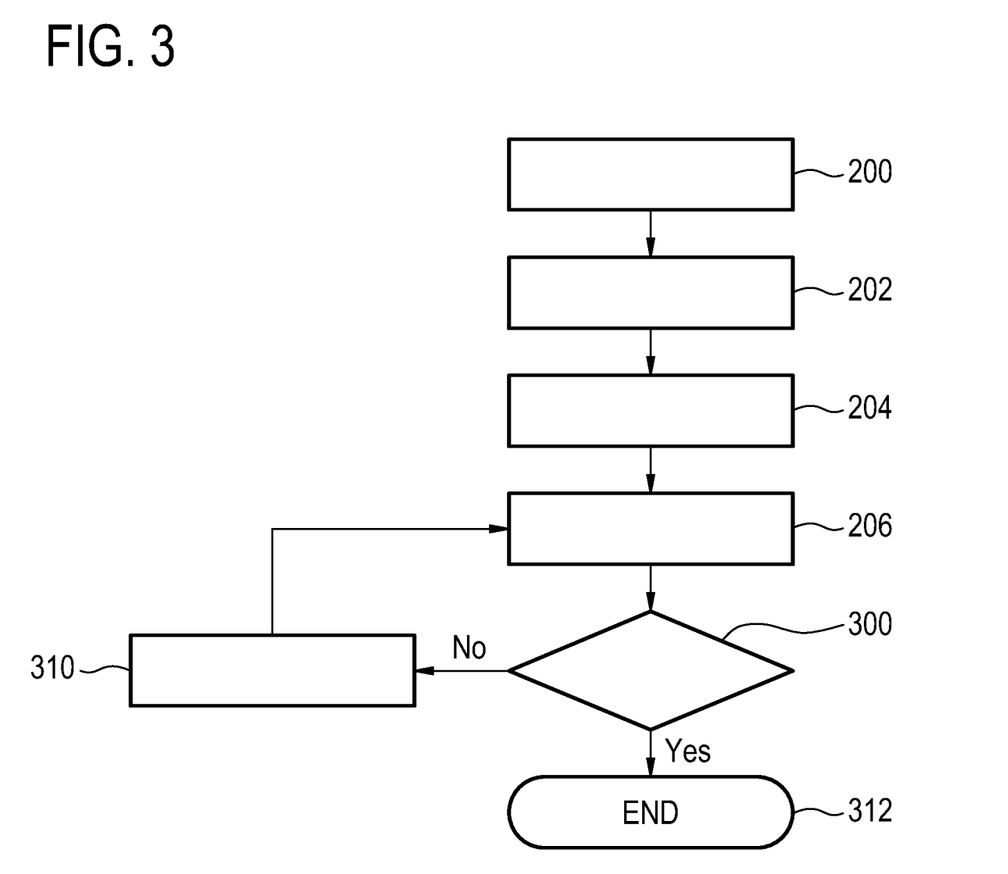
FIG. 3 shows a flow chart which shows a further method of operating the medical imaging system of FIG. 1.

FIG. 3 shows a further flowchart which illustrates a further method of operating the medical imaging system 100 of FIG. 1. The method in FIG. 3 for the first four steps 200, 202, 204 and 206 are identical with the method illustrated in FIG. 2. After step 206 has been performed the method then proceeds to the question box 300. The question box 300 may take different forms in different examples. In one example the calculation of the second QSM image is performed iteratively a fixed number of times. In this first example the question may be has the number of iterations been performed. If the answer is yes the method proceeds to box 312 and the method ends. If the answer is no the method proceeds to box 310 and the first segmentation is recalculated by segmenting the existing second QSM image.

Next the method then proceeds back to step 206 and the second QSM image is then reconstructed using the first segmentation 126 that was just recalculated. The method may then repeat until the number of iterations is reached. In another example the question box 300 may represent comparing the present second QSM image to a second QSM image that was calculated in a previous iteration. This for example may be used to see if the second QSM image has converged. Various statistical measures such as preparing pixels or voxels on a voxel-by-voxel basis may be used to evaluate if the second QSM image 128 has converged to a solution.

Figure 4:
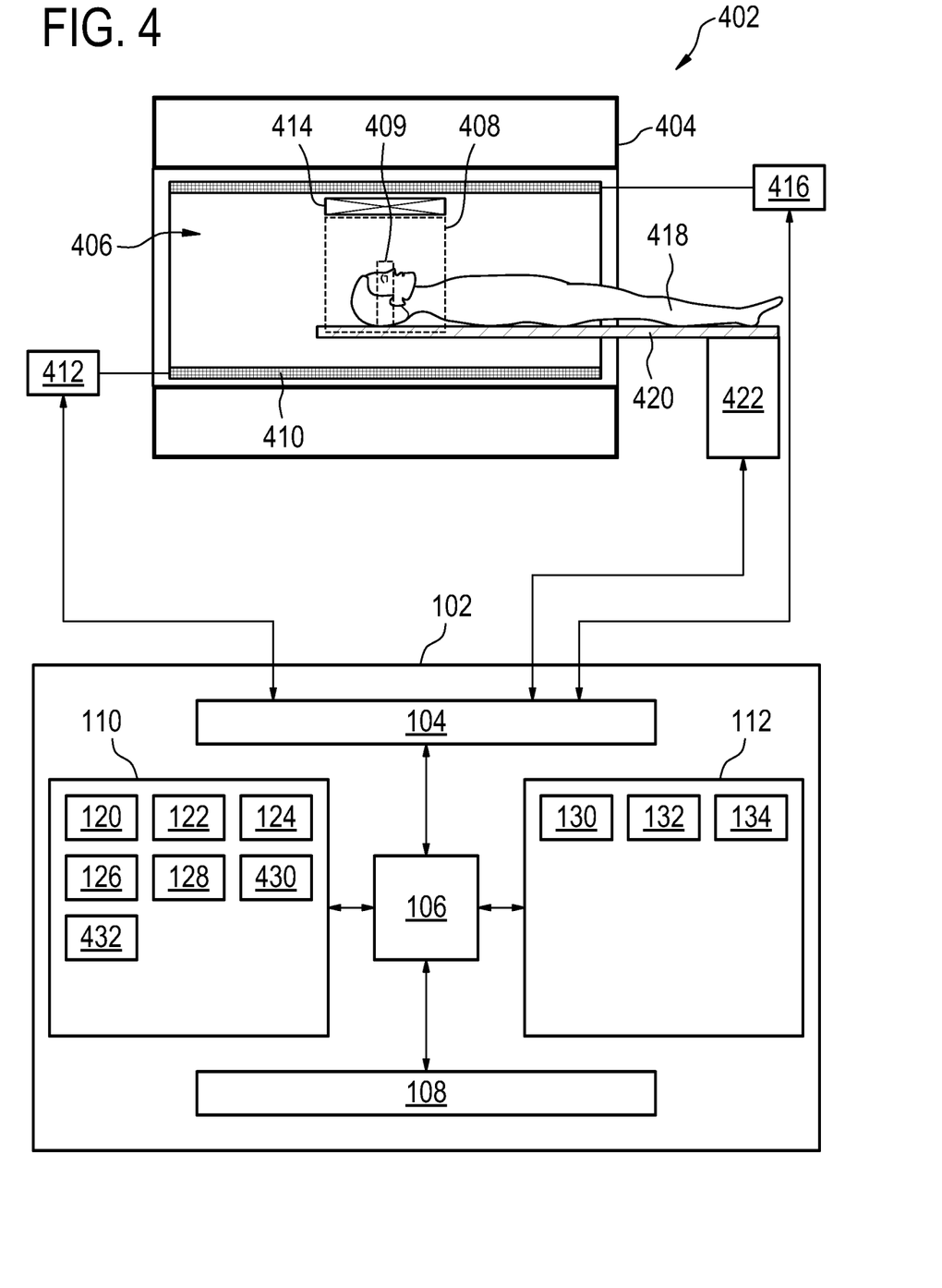
FIG. 4 illustrates a further example of a medical imaging system.

FIG. 4 shows a further example of a medical imaging system 400. In this example the medical imaging system 400 further comprises a magnetic resonance imaging system 402. The medical imaging system 400 also comprises a computer system 102 such as illustrated in FIG. 1. The processor 106 is used to control the magnetic resonance imaging system 402.

The medical imaging system 400 comprises a magnetic resonance imaging system 402 and a computer system 102 with a processor 106 that is equivalent to the medical imaging system 100 shown in FIG. 1. The magnetic resonance imaging system 402 comprises a magnet 404. The magnet 404 is a superconducting cylindrical type magnet 404 with a bore 406 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 406 of the cylindrical magnet 404 there is an imaging zone 408 where the magnetic field is strong and uniform enough to perform magnetic resonance imaging.

Within the bore 406 of the magnet there is also a set of magnetic field gradient coils 410 which is used for acquisition of magnetic resonance data to spatially encode magnetic spins within the imaging zone 408 of the magnet 404. The magnetic field gradient coils 410 are connected to a magnetic field gradient coil power supply 412. The magnetic field gradient coils 410 are intended to be representative. Typically magnetic field gradient coils 410 contain three separate sets of coils for spatially encoding in three orthogonal spatial directions. A magnetic field gradient power supply supplies current to the magnetic field gradient coils. The current supplied to the magnetic field gradient coils 410 is controlled as a function of time and may be ramped or pulsed.

Adjacent to the imaging zone 408 is a radio-frequency coil 414 for manipulating the orientations of magnetic spins within the imaging zone 408 and for receiving radio transmissions from spins also within the imaging zone 408. A region of interest 409 within the imaging zone 408 is shown. The radio frequency antenna may contain multiple coil elements. The radio frequency antenna may also be referred to as a channel or antenna. The radio-frequency coil 414 is connected to a radio frequency transceiver 416. The radio-frequency coil 414 and radio frequency transceiver 416 may be replaced by separate transmit and receive coils and a separate transmitter and receiver. It is understood that the radio-frequency coil 414 and the radio frequency transceiver 416 are representative. The radio-frequency coil 414 is intended to also represent a dedicated transmit antenna and a dedicated receive antenna. Likewise the transceiver 416 may also represent a separate transmitter and receiver. The radio-frequency coil 414 may also have multiple receive/transmit elements and the radio frequency transceiver 416 may have multiple receive/transmit channels.

The subject support 420 is attached to an optional actuator 422 that is able to move the subject support and the subject 418 through the imaging zone 408. In this way a larger portion of the subject 418 or the entire subject 418 can be imaged. The transceiver 416, the magnetic field gradient coil power supply 412 and the actuator 422 are all see as being connected to a hardware interface 104 of computer system 102. The computer system 102 is equivalent to the computer system 102 shown in FIG. 1.

The computer storage 110 is shown as containing QSM pulse sequence commands 430. These commands enable the processor 106 to control the magnetic resonance imaging system 402 to acquire the QSM magnetic resonance data 220 for the region of interest 409. The computer storage 110 is also further shown as containing optional survey scan pulse sequence commands 432. For example the processor 106 may use the survey scan pulse sequence commands 432 to control the magnetic resonance imaging system 402 to acquire the preliminary magnetic resonance data 120 from a region that at least includes the region of interest 409.

Figure 5:
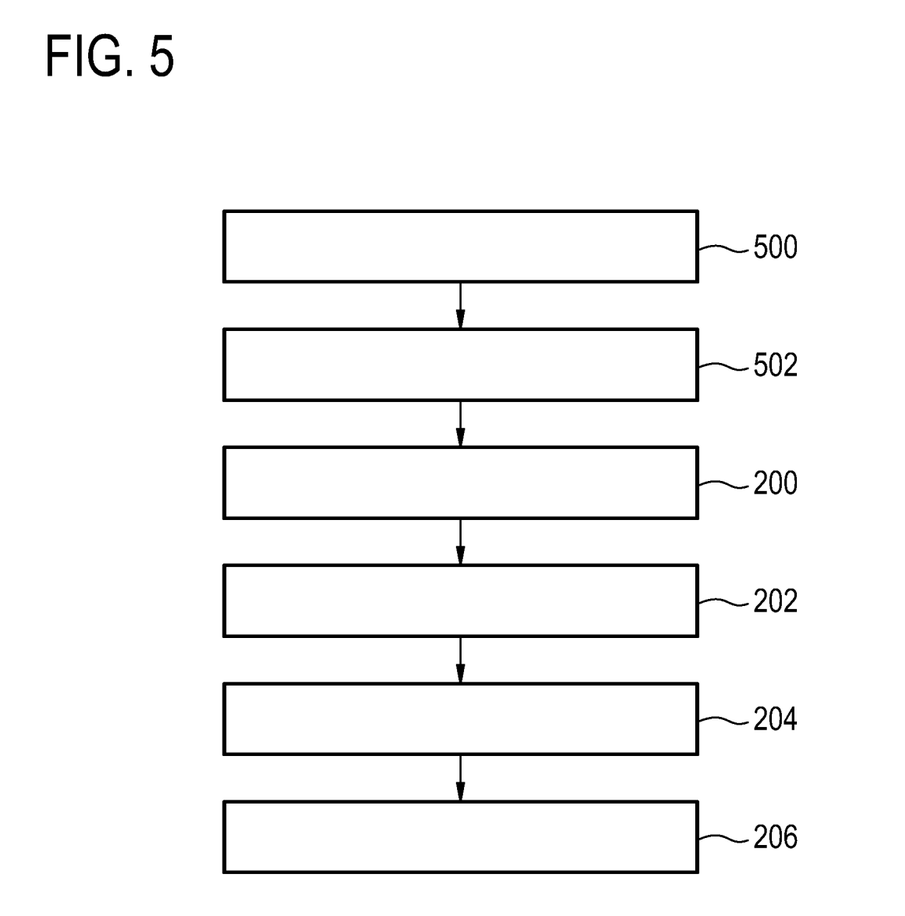
FIG. 5 shows a flow chart which shows a method of operating the medical imaging system of FIG. 4.

FIG. 5 shows a flowchart which illustrates a method of controlling the medical imaging system 400 of FIG. 4. In the method illustrated in FIG. 5 the preliminary magnetic resonance image 122 is a QSM image that is calculated from the QSM magnetic resonance data 120. In the first iteration the QSM magnetic resonance image is calculated without using segmentation edges to control the operation of the regularization function. First in step 500 the processor 106 controls the magnetic resonance imaging system 402 with the QSM pulse sequence commands 430 to acquire the QSM magnetic resonance data 120. In this case the preliminary magnetic resonance data 120 may not be present in the system. Next in step 502 the preliminary magnetic resonance image 122 is reconstructed or calculated from the preliminary magnetic resonance data 120. In this case it is also a QSM magnetic resonance image. The method then continues to step 200 and is equivalent to the method shown in FIG. 2. In step 200 the receiving of the preliminary segmentation comprises calculating the preliminary segmentation by segmenting the first QSM image using the QSM image segmenting algorithm.

Figure 6:
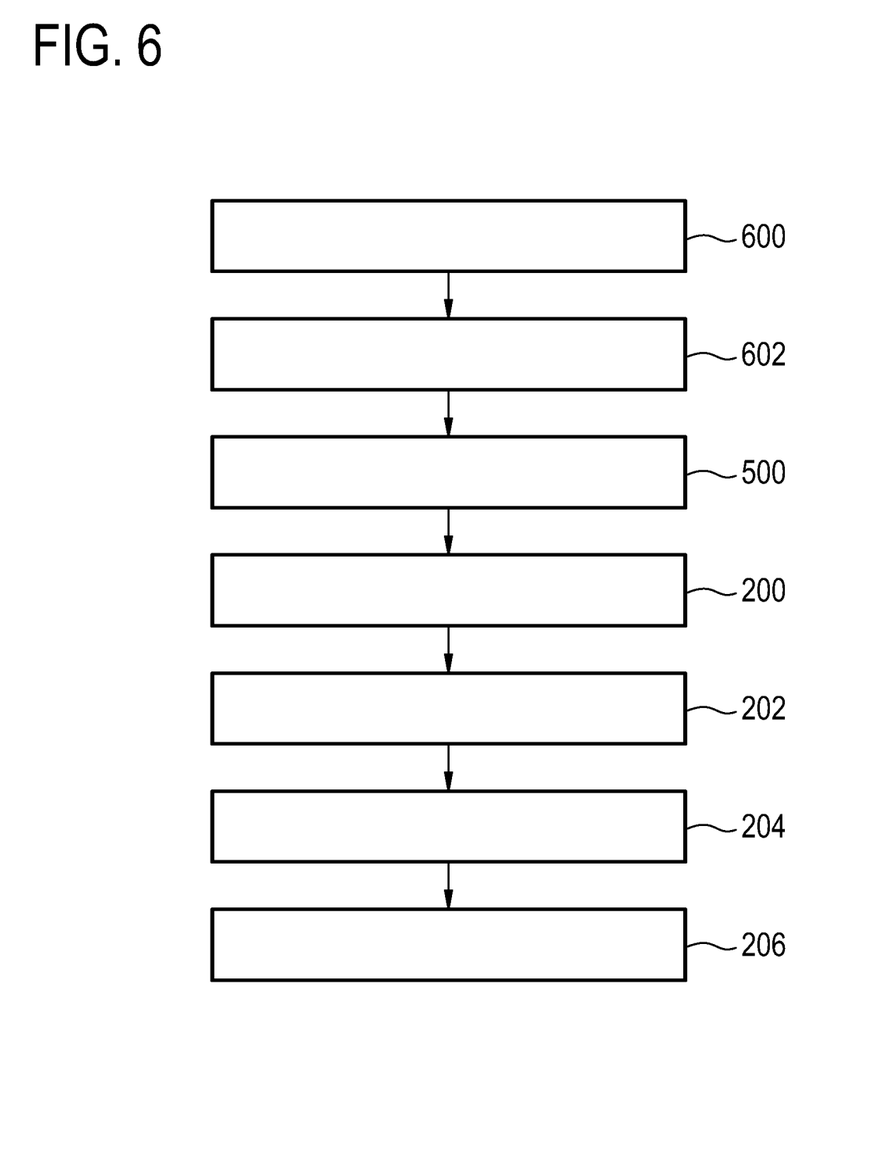
FIG. 6 shows a QSM image showing segmentation calculated using gradient-derived edges.

FIG. 6 shows a flowchart which illustrates an alternate method of controlling the medical imaging system 400. In the method illustrated in FIG. 6 the preliminary magnetic resonance image is a survey magnetic resonance image which is acquired by the magnetic resonance imaging system 402. First in step 600 the preliminary magnetic resonance data 120, which may also be referred to as the survey magnetic resonance imaging data, may be acquired by controlling the magnetic resonance imaging system with survey scan pulse sequence commands 432. Next in step 602 the preliminary magnetic resonance image 122, which is also referred to as the survey magnetic resonance image in this example, is reconstructed from the preliminary magnetic resonance data 120.

Next the method proceeds to step 500 where the QSM magnetic resonance data 120 is acquired by controlling the magnetic resonance imaging system 402 with QSM pulse sequence commands 430. The method then proceeds to steps 200, 202, 204 and 206 as are illustrated in FIG. 2. In this example step 200, which is to receive the preliminary segmentation, comprises calculating the preliminary segmentation by segmenting the preliminary magnetic resonance image 122.

The methods shown in FIGS. 5 and 6 may be modified in several ways. For example the iterative method illustrated in FIG. 3 may also be combined with FIGS. 5 and 6. FIG. 5 may also be further modified. In FIG. 5 there are three QSM reconstructions of the QSM magnetic resonance data 120. In some examples the method shown in FIG. 5 may be stopped after step 202.

Quantitative Susceptibility Mapping is an emerging technique to reconstruct the tissue magnetic susceptibility from single- or multi-echo gradient echo MRI. One of the central challenges in QSM reconstruction is the inherent loss of information in the mapping from the tissue susceptibility to the resulting field perturbation, making QSM reconstruction an ill-posed inverse problem. Many approaches have been proposed to improve the conditioning of the problem by regularization, the most successful ones employing a gradient-based regularization in combination with additional information about the geometry of the tissue distribution derived from magnitude images.

Current algorithms employ masks derived from magnitude images by applying a threshold to the modulus of the image gradient vector. Due to noise in the images, this leads to ill-defined tissue edges, if voxels are falsely identified as not belonging to an edge. In addition, other voxels, which are far away from tissue boundaries might be misclassified as edges due to noise or errors in the signal model, e.g. due to flow. As a consequence, the regularization term penalizes gradients in the susceptibility in the wrong locations and prevents the reconstructed susceptibility in adjacent tissues from being independent. This problem can be overcome by using an approach based on segmentation, which leads to well-defined boundaries between adjacent tissues and allows full decoupling of the susceptibility difference.

The majority of segmentation software packages work on T1-weighted images with magnetization preparation using an inversion pulse. These images show poor contrast for several prominent structures in the brain, such as putamen, globus pallidus, red nucleus, substantia nigra and dentate nucleus, which bears the risk of errors in the segmentation. These errors will then propagate in the reconstructed susceptibility if segmented and actual tissue boundaries do not overlap.

This invention proposes to iteratively update the segmentation to include new information about tissue geometry. After initialization of the segmentation, e.g. using T1-weighted images, a first susceptibility map is reconstructed guided by gradient-derived magnitude edges and/or edges derived from the initial segmentation. The resulting susceptibility map is used to refine the segmentation to improve the initial segmentation, see FIG. 7 below, to better describe tissue boundaries in the susceptibility, see FIG. 8 below.

Figure 7:
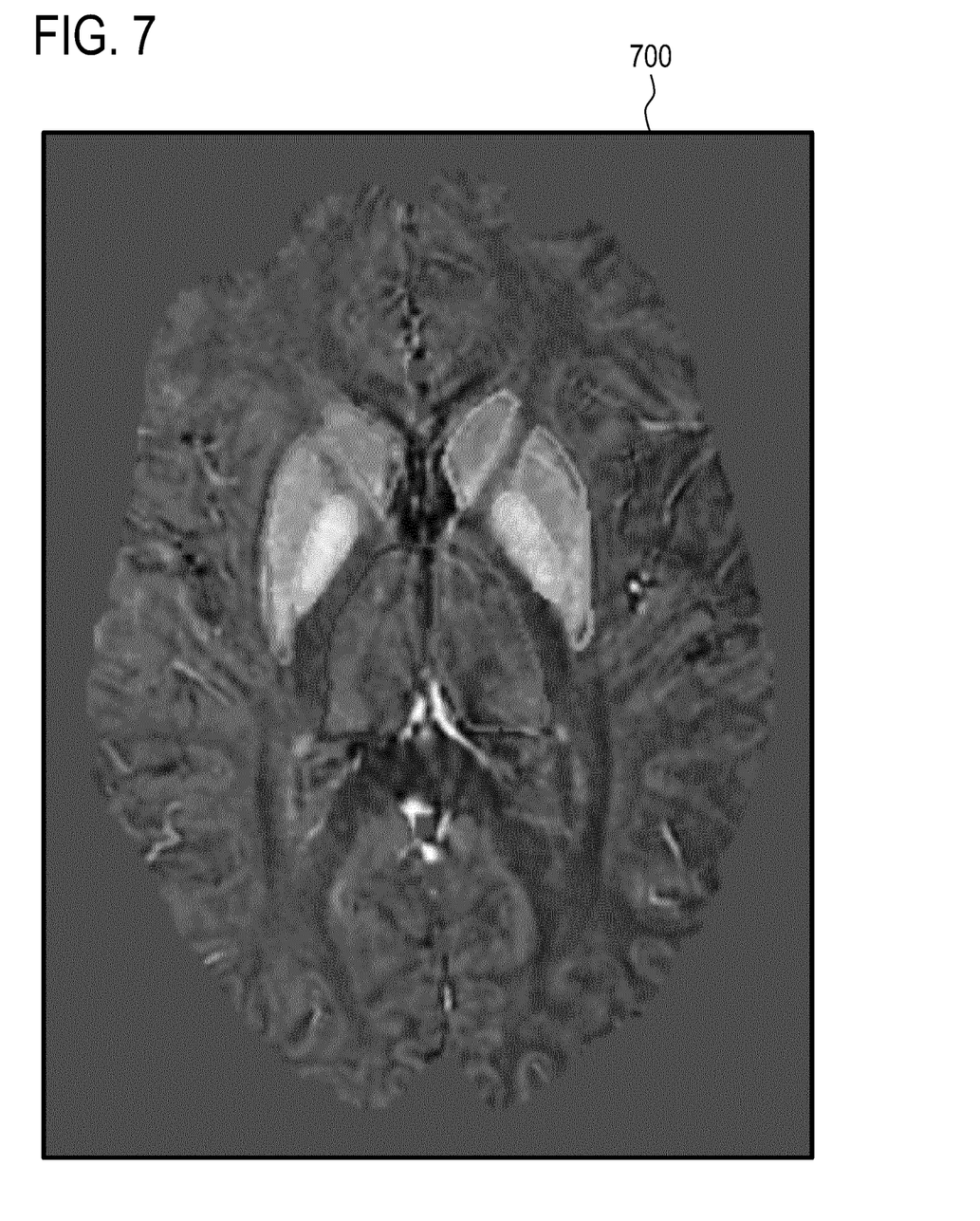
FIG. 7 shows a QSM image showing segmentation for the image of FIG. 6 calculated using a QSM image segmentation module.
Figure 8:
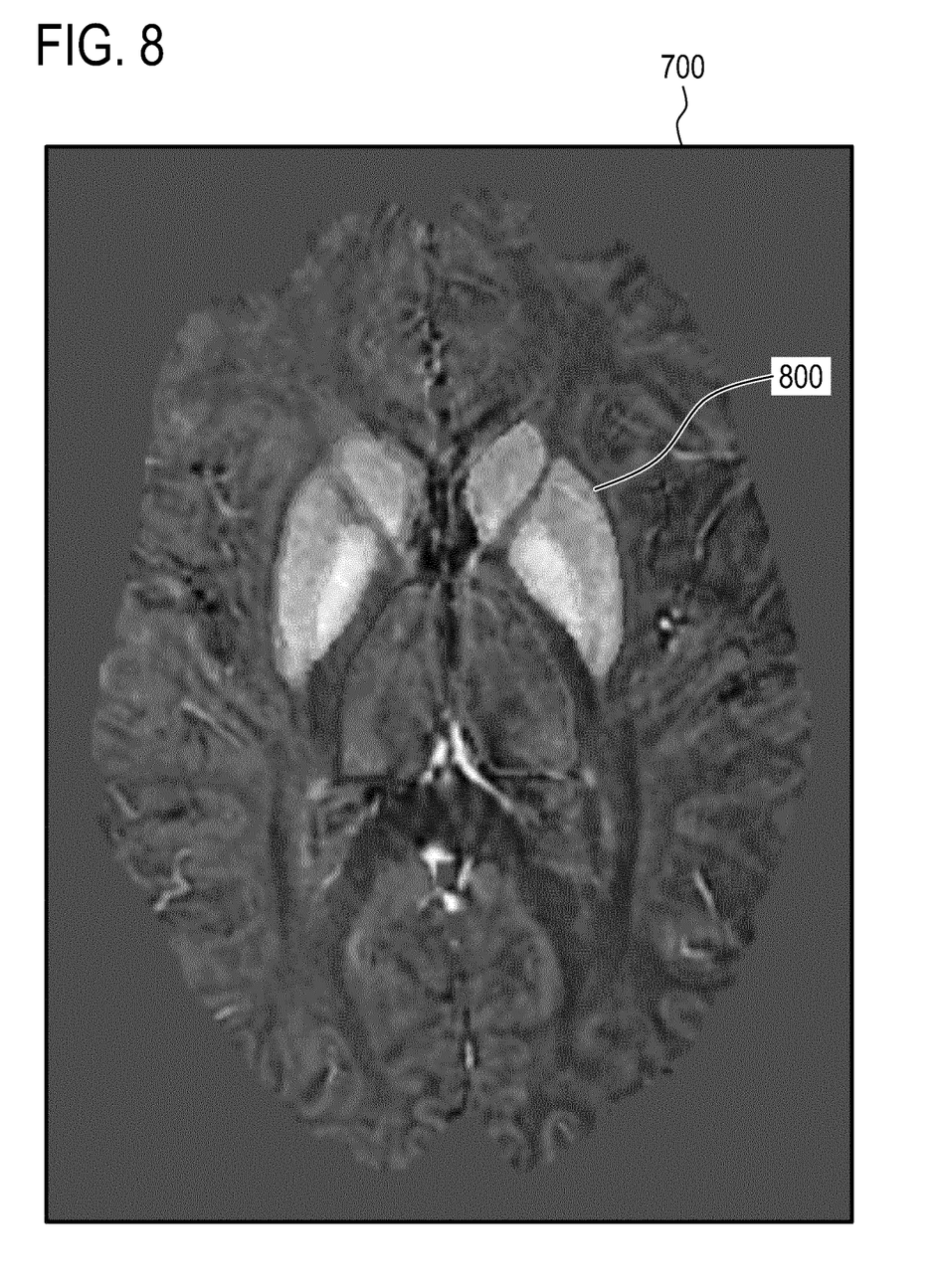
FIG. 8 is another exemplary QSM image using an image module segmentation modified to identify structures in the image accordance with aspects of the present invention.

FIGS. 7 and 8 show an example of a QSM image 700. In FIG. 7 the QSM image 700 is shown with eight segmentations. The segmentations shown in FIG. 7 are from an initial segmentation for example from a survey image. Upon examining FIG. 7 it can be seen that the segmentations do not line up with all of the structures shown in the QSM image 700 very well.

In contrast in FIG. 8 the segmentation has been performed on the QSM image 700 using an image segmentation module that has been modified to find the structures in the QSM image 700. It can be seen that the segmentation is much more accurate and better fits the anatomy of the subject shown in image 700. The segmentations shown in FIG. 8 may be an example of a first segmentation of the QSM image. The segmentations 800 may be used for further reconstruction of the QSM image again.

After a new susceptibility map has been reconstructed with the improved prior information, the procedure can be iterated as necessary. This leads to coinciding edges in susceptibility and segmentation, and thus allows retaining the advantages of the segmentation-based approach.

Some example methods may include one or more of the following steps:

1. Data-acquisition for QSM employs a suitable single- or multi-echo gradient-echo sequence.

2. Field-mapping and background-field removal proceed using any suitable method.

3. Segmentation can be implemented using a deformable shape model and initial segmentation can be achieved using an additional T1-weighted, magnetization prepared scan as is commonly employed in neuro-imaging. Alternatively, segmentation can be performed on the magnitude images of the multi-echo QSM scan, or images derived from the phase images.

4. Once the initial segmentation is available, QSM reconstruction is performed using edge-information derived from the region labels, e.g. using gradient operations using any algorithm which can incorporate image-space information about the location of edges. In this step other sources of information about edges in the images can also be used such as magnitude images, phase-images or other derived images.

5. An updated segmentation is obtained by rerunning the segmentation algorithm, now including the current reconstructed susceptibility image.

6. Steps 4 and 5 are iterated until no further improvement is obtained.

Another alternative would be to skip step 3 above and to postpone segmentation until the first approximate susceptibility solution is available for segmentation.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 medical imaging system
102 computer system
104 hardware interface
106 processor
108 user interface
110 computer storage
112 computer memory
120 preliminary magnetic resonance data
122 preliminary magnetic resonance image
124 preliminary segmentation
122 QSM magnetic resonance data
124 first QSM image
126 first segmentation
128 second QSM image
130 machine executable instructions
132 survey scan image segmentation algorithm
134 QSM image segmentation algorithm
200 receive a preliminary segmentation from a preliminary magnetic resonance image of a region of interest, wherein the preliminary segmentation comprises preliminary segmentation edges
202 reconstruct a first QSM image for a region of interest from QSM magnetic resonance data, wherein the reconstruction of the QSM image is at least partially performed using a regularization function
204 calculate a first segmentation by segmenting the first QSM image using a QSM image segmentation algorithm, wherein the first segmentation comprises first segmentation edges
206 reconstruct a second QSM image for the region of interest from the QSM magnetic resonance data
300 number of iterations reached? or has the second QSM image converged?
310 recalculate the first segmentation by segmenting the second QSM image using the QSM image segmentation algorithm
312 end
400 medical imaging system
402 magnetic resonance imaging system
404 magnet
406 bore of magnet
408 measurement zone or imaging zone
409 region of interest
410 magnetic field gradient coils
412 magnetic field gradient coil power supply
414 radio-frequency coil
416 transceiver
418 subject
420 subject support
422 actuator
430 QSM pulse sequence commands
432 survey scan pulse sequence commands
500 acquire QSM magnetic resonance data according to a Magnetic Resonance Quantitative Susceptibility Mapping protocol
502 reconstruct the preliminary image for the region of interest from the QSM magnetic resonance imaging data
600 acquire survey magnetic resonance imaging data by controlling the magnetic resonance imaging system with the survey image pulse sequence commands
602 reconstruct the survey magnetic resonance image using the survey magnetic resonance imaging data
700 QSM image
800 image segmentation

The invention claimed is:

1. A medical imaging system comprising:
a memory for storing machine executable instructions;
a processor for controlling the medical imaging system, wherein execution of the machine executable instructions causes the processor to:
reconstruct a preliminary image for a region of interest from quantitative susceptibility mapping (QSM) magnetic resonance imaging data;
determine a preliminary segmentation by segmenting the preliminary image using a QSM imaging segmentation algorithm, wherein the preliminary segmentation comprises preliminary segmentation edges;
reconstruct a first QSM image for the region of interest from the QSM magnetic resonance data, wherein the reconstruction of the first QSM image is at least partially performed using a regularization function, wherein the regularization function is dependent upon the preliminary segmentation edges during reconstruction of the first QSM image;
calculate a first segmentation by segmenting the first QSM image using a QSM image segmentation algorithm, wherein the first segmentation comprises first segmentation edges; and
reconstruct a second QSM image for the region of interest from the QSM magnetic resonance data, wherein the reconstruction of the second QSM image is at least partially performed using the regularization function, wherein the regularization function is dependent upon the first segmentation edges.

2. The medical imaging system of claim 1, wherein execution of the machine executable instructions further cause the processor to iteratively:
recalculate the first segmentation by segmenting the second QSM image using the QSM image segmentation algorithm; and
reconstruct the second QSM image for the region of interest from the QSM magnetic resonance data.

3. The medical imaging system of claim 2, wherein the iterative reconstruction of the second QSM image is performed a predetermined number of times.

4. The medical imaging system of claim 2, wherein the iterative reconstruction of the second QSM image is performed until a convergence metric is within a predetermined range.

5. The medical imaging system of claim 1, wherein the medical imaging system further comprises a magnetic resonance imaging system, wherein the memory further stores QSM pulse sequence commands, wherein the QSM pulse sequence commands cause the magnetic resonance imaging system to acquire (500) QSM magnetic resonance data according to a Magnetic Resonance Quantitative Susceptibility Mapping protocol, wherein execution of the machine executable instructions causes the processor to control the magnetic resonance imaging system to acquire the QSM magnetic resonance imaging data using the QSM pulse sequence commands.

6. The medical imaging system of claim 1, wherein the preliminary image is a survey image.

7. The medical imaging system of claim 6, wherein receiving the preliminary segmentation comprises calculating the preliminary segmentation by segmenting the preliminary image using a survey image segmentation algorithm.

8. The medical imaging system of claim 7, wherein the memory further contains survey image pulse sequence commands, wherein execution of the machine executable instructions further causes the processor to:
acquire survey magnetic resonance imaging data by controlling the medical imaging system with the survey image pulse sequence commands; and
reconstruct the survey magnetic resonance image using the survey magnetic resonance imaging data.

9. The medical imaging system of claim 1, wherein reconstructing the first QSM image and/or the second QSM image comprises solving:

$$\chi = \arg\min \; \| W_1 \left( L\left(\frac{B_o\gamma}{2\pi}D(\chi)\right) - L(f) \right) \| + \lambda \| W_2 \; \vec{G}(\chi) \|,$$

as a least squares problem, wherein $B_0$ is an external magnetic field, $\gamma$ is a gyromagnetic ratio, D is a dipole operator, L is a Laplacian, $\lambda$ is a regularization parameter, $\vec{G}$ is a gradient operator, $W_1$ is a binary mask for data-fidelity, and $W_2$ is a binary mask for regularization.

10. The medical imaging system of claim 1, wherein the QSM image segmentation algorithm is trained and/or configured using QSM images.

11. A method of operating a medical imaging system, the method comprising:

reconstruct a preliminary image for a region of interest from quantitative susceptibility mapping (QSM) magnetic resonance imaging data;

determining a preliminary segmentation by segmenting the preliminary image using a QSM imaging segmentation algorithm, wherein the preliminary segmentation comprises preliminary segmentation edges;

reconstructing a first QSM image for the region of interest from QSM magnetic resonance data, wherein the reconstruction of the QSM image is at least partially performed using a regularization function, wherein a plenalty function is dependent upon the preliminary segmentation edges during reconstruction of the first QSM image;

calculating a first segmentation by segmenting the first QSM image using a QSM image segmentation algorithm, wherein the first segmentation comprises first segmentation edges; and reconstructing a second QSM image for the region of interest from the QSM magnetic resonance data, wherein the reconstruction of the second QSM image is at least partially performed using the regularization function, wherein the regularization function is dependent upon the first segmentation edges; and, iteratively:

recalculating the first segmentation by segmenting the second QSM image using the QSM image segmentation algorithm; and reconstructing the second QSM image for the region of interest from the QSM magnetic resonance data.

12. The method of claim 11, wherein the iterative reconstructing of the second QSM image comprises performing the iterative reconstructing multiple times.

13. The method of claim 11, wherein the iterative reconstructing of the second QSM image comprises performing the iterative reconstructing until a convergence metric is within a predetermined range.

14. The method of claim 11, wherein the preliminary image is a survey image.

15. The method of claim 14, wherein receiving the preliminary segmentation comprises calculating the preliminary segmentation by segmenting the preliminary image using a survey image segmentation algorithm.

16. The method of claim 15, wherein the method further comprises:
acquiring survey magnetic resonance imaging data by controlling a medical imaging system with survey image pulse sequence commands; and
reconstructing the survey magnetic resonance image using the survey magnetic resonance imaging data.

17. A tangible, non-transitory computer readable medium that stores machine executable instructions, which, when executed by a processor controlling a medical imaging system, causes the processor to:

reconstruct a preliminary magnetic resonance image for a region of interest from quantitative susceptibility mapping (QSM) magnetic resonance imaging data;

determine a preliminary segmentation by segmenting the preliminary image using a QSM imaging segmentation algorithm, wherein the preliminary segmentation comprises preliminary segmentation edges;

reconstruct a first QSM image for the region of interest from QSM magnetic resonance data, wherein the reconstruction of the first QSM image is at least partially performed using a regularization function, wherein a plenalty function is dependent upon the preliminary segmentation edges during reconstruction of the first QSM image;

calculate a first segmentation by segmenting the first QSM image using a QSM image segmentation algorithm, wherein the first segmentation comprises first segmentation edges; and reconstruct a second QSM image for the region of interest from the QSM magnetic resonance data, wherein the reconstruction of the second QSM image is at least partially performed using the regularization function, wherein the regularization function is dependent upon the first segmentation edges; and, iteratively:

recalculate the first segmentation by segmenting the second QSM image using the QSM image segmentation algorithm; and reconstruct the second QSM image for the region of interest from the QSM magnetic resonance data.

18. The tangible, non-transitory computer readable medium of claim 17, wherein the iterative reconstruction of the second QSM image is performed multiple times.

19. The tangible, non-transitory computer readable medium of claim 17, wherein the iterative reconstruction of the second QSM image is performed until a convergence metric is within a predetermined range.

20. The tangible, non-transitory computer readable medium of claim 17, wherein the preliminary magnetic resonance image is a survey image.

21. The tangible, non-transitory computer readable medium of claim 20, wherein receiving the preliminary segmentation causes the processor to calculate the preliminary segmentation by segmenting the preliminary magnetic resonance image using a survey image segmentation algorithm.

22. The tangible, non-transitory computer readable medium of claim 21, wherein the machine executable instructions, which, when executed by a processor controlling the medical imaging system, further cause the processor to:
acquire survey magnetic resonance imaging data by controlling a medical imaging system with survey image pulse sequence commands; and
reconstruct the survey magnetic resonance image using the survey magnetic resonance imaging data.

* * * * *